United States Patent
Naruoka et al.

(10) Patent No.: US 6,844,242 B2
(45) Date of Patent: Jan. 18, 2005

(54) METHOD OF MANUFACTURING SOI WAFER

(75) Inventors: Hideki Naruoka, Tokyo (JP); Nobuyoshi Hattori, Tokyo (JP); Hidekazu Yamamoto, Tokyo (JP)

(73) Assignee: Renesas Technology Corp., Tokyo (JP)

(*) Notice: Subject to any disclaimer, the term of this patent is extended or adjusted under 35 U.S.C. 154(b) by 113 days.

(21) Appl. No.: 10/113,291

(22) Filed: Apr. 2, 2002

(65) Prior Publication Data

US 2003/0013273 A1 Jan. 16, 2003

(30) Foreign Application Priority Data

Jul. 13, 2001 (JP) ........................ 2001-213648

(51) Int. Cl.[7] .................. H01L 21/30; H01L 21/46
(52) U.S. Cl. .................. 438/455; 438/459; 206/710; 206/711; 206/712; 414/938
(58) Field of Search ................. 438/455, 459

(56) References Cited

U.S. PATENT DOCUMENTS

| | | | | |
|---|---|---|---|---|
| 4,752,180 A | * | 6/1988 | Yoshikawa | 414/737 |
| 4,854,986 A | * | 8/1989 | Raby | 156/87 |
| 5,306,370 A | * | 4/1994 | Herko et al. | 156/155 |
| 5,314,107 A | * | 5/1994 | d'Aragona et al. | 228/116 |
| 5,665,631 A | | 9/1997 | Lee et al. | |
| 5,725,101 A | * | 3/1998 | Kakizaki et al. | 206/711 |
| 6,383,890 B2 | * | 5/2002 | Takisawa et al. | 438/455 |

FOREIGN PATENT DOCUMENTS

| | | |
|---|---|---|
| JP | 9-246506 | 9/1997 |
| JP | 2000-294526 | 10/2000 |

* cited by examiner

*Primary Examiner*—John F. Niebling
*Assistant Examiner*—Angel Roman
(74) *Attorney, Agent, or Firm*—Oblon, Spivak, McClelland, Maier & Neustadt, P.C.

(57) ABSTRACT

A boat (4) has a recess (5) for supporting a laminated wafer (50). The recess (5) has a first side surface (5a), a first bottom surface (5b), a second side surface (5c), a second bottom surface (5d) and a third side surface (5e). Viewing from an upper surface of the boat (4), the second bottom surface (5d) is located in a position lower than the first bottom surface (5b). The laminated wafer (50) is mounted on the boat (4) in the state that a side surface of a first silicon wafer (1) is not in contact with the second bottom surface (5d) of the recess (5) and a side surface of a second silicon wafer (2) is in contact with the first bottom surface (5b) of the recess (5). A second main surface (2a) of the second silicon wafer (2) is in contact with the first side surface (5a) of the recess (5) and a second main surface (1a) of the first silicon wafer (1) is in contact with the third side surface (5e) of the recess (5).

11 Claims, 19 Drawing Sheets

F I G . 1 2
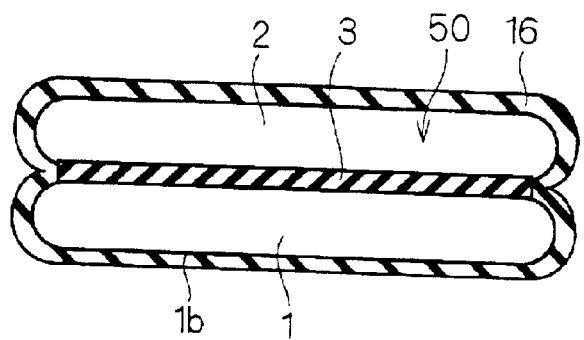
F I G . 1 3
F I G . 1 4
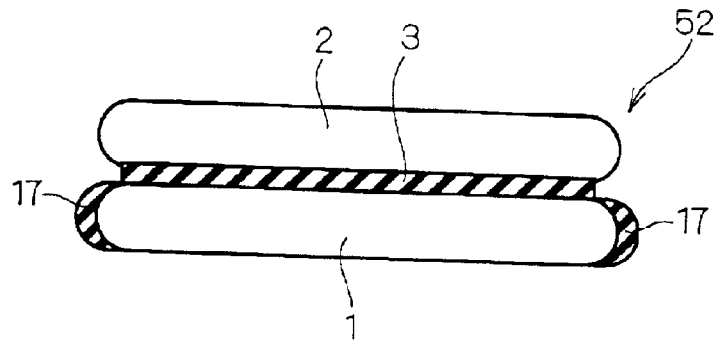

F I G . 2 2
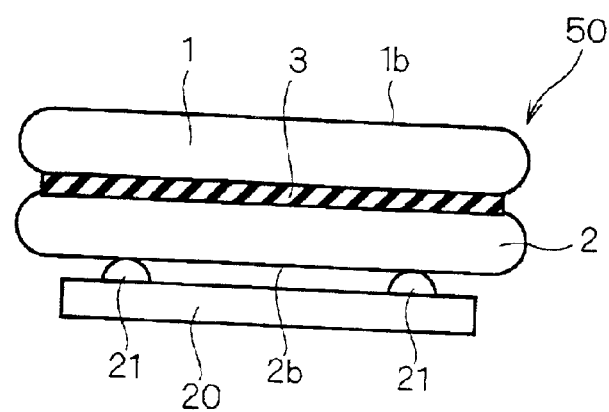

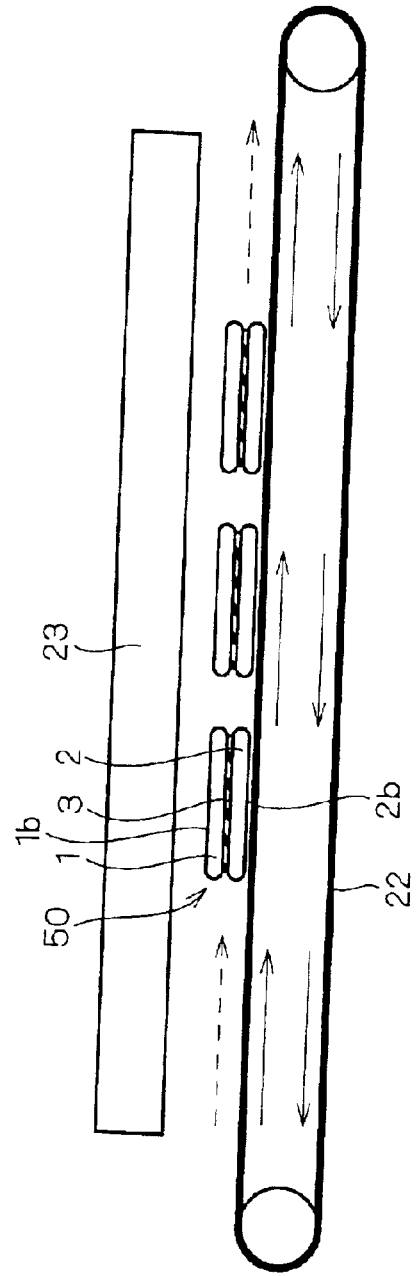

METHOD OF MANUFACTURING SOI WAFER

BACKGROUND OF THE INVENTION

1. Field of the Invention

The present invention relates to a method of manufacturing an SOI (silicon-on-insulator) wafer used as a substrate for a semiconductor device.

2. Description of the Background Art

Among methods of manufacturing SOI wafers is a bonding method. In this method, two silicon wafers, at least one of which has a silicon oxide film formed thereon, are bonded to each other with the silicon oxide film interposed therebetween, and thereafter, one of the silicon wafers is made into a thin film, thereby forming a silicon layer (hereinafter referred to as "element forming layer") on which a semiconductor element is to be formed. Among thin-film techniques for silicon wafers, methods are known such as chemical-mechanical polishing, bonding and etch back, and hydrogen implanting separation (Smart-Cut: registered trademark).

In the chemical-mechanical polishing, a silicon wafer to be an element forming layer is made into a thin film by polishing using an abrasive cloth and an alkaline solution including abrasive particles (particles of the silicon oxide, etc). In the bonding and etch back, a layer (an impurity layer of high concentration, a porous silicon layer, and the like) having an etching rate different from that of a silicon wafer to be an element forming layer is formed beforehand on the silicon wafer, and the silicon wafer is made into a thin film by chemical etching using hydrofluoric acid or a liquid mixture of hydrofluoric acid and nitric acid. In the hydrogen implanting separation, hydrogen is implanted beforehand into a silicon wafer to be an element forming layer to form a hydrogen implanted layer, and the hydrogen implanted layer is separated by heat treatment at about 500° C., thereby making the silicon wafer into a thin film.

FIGS. 31 through 39 show a conventional method of manufacturing an SOI wafer in sequential order. Referring to FIG. 31, prepared first is a silicon wafer 101 to be a supporting substrate of the SOI wafer. The silicon wafer 101 has a first main surface 101a and a second main surface 101b. Referring to FIG. 32, prepared further is a silicon wafer 102 to be an element forming layer of the SOI wafer. The silicon wafer 102 has a first main surface 102a and a second main surface 102b. An insulation layer 103 made of a silicon oxide film is formed on the first main surface 102a of the silicon wafer 102. The insulation layer 103 may be formed on the entire surface of the silicon wafer 102. Next, referring to FIG. 33, the silicon wafers 101 and 102 are bonded to each other with the insulation layer 103 interposed therebetween, thereby forming a wafer 150 in which the silicon wafer 101, the insulation layer 103 and the silicon wafer 102 are laminated in this order (the wafer 150 is hereinafter referred to as "laminated wafer").

Next, to improve the bonding strength between the silicon wafers 101 and 102, heat treatment (anneal at about 1000° C.) is conducted. More specifically, using a horizontal diffusion furnace shown in FIG. 34, a boat 151 with a plurality of laminated wafers 150 mounted thereon is transferred into a quartz tube 152, where the laminated wafers 150 are heated by a heater 153. Alternatively, using a vertical diffusion furnace shown in FIG. 35, a boat 154 with the plurality of laminated wafers 150 mounted thereon is transferred into a quartz tube 155, where the laminated wafers 150 are heated by a heater 156.

FIGS. 36 and 37 show the inside of the horizontal diffusion furnace shown in FIG. 34. A plurality of wafer supporting parts 158 are formed on a bottom 157 of the boat 151, and the laminated wafers 150 are supported by the wafer supporting parts 158. The wafer supporting parts 158 are band-like members 159 with a plurality of recesses 160 formed thereon at regular intervals. As shown in FIG. 37, the second main surface 101b of the silicon wafer 101 is in contact with a side surface 160s1 of one of the recesses 160, and a side surface of the silicon wafer 101 is in contact with a bottom surface 160b of one of the recesses 160. The second main surface 102b of the silicon wafer 102 is in contact with a side surface 160s2 of one of the recesses 160, and a side surface of the silicon wafer 102 is in contact with the bottom surface 160b of one of the recesses 160.

FIGS. 38 and 39 show the inside of the vertical diffusion furnace shown in FIG. 35. FIG. 39 shows a sectional structure taken along the line X100—X100 shown in FIG. 38. The laminated wafers 150 are supported by a plurality of wafer supporting parts 161 included in the boat 154. The wafer supporting parts 161 are band-like members 162 with a plurality of recesses 163 formed thereon at regular intervals. As shown in FIG. 39, the second main surface 101b of the silicon wafer 101 is in contact with a bottom surface 163b of one of the recesses 163, and the side surface of the silicon wafer 101 is in contact with a side surface 163s of one of the recesses 163. The side surface of the silicon wafer 102 is in contact with the side surface 163s of one of the recesses 163.

After conducting heat treatment for improving the bonding strength, the silicon wafer 102 is made into a thin film from the side of the second main surface 102b using the above-described chemical-mechanical polishing or the like. Accordingly, an element forming layer is formed and an SOI wafer is completed.

However, the aforementioned conventional method of manufacturing an SOI wafer has the following problem. FIGS. 40 and 41 are explanatory views of the problem in the conventional method of manufacturing an SOI wafer. As shown in FIG. 37, the side surface of the silicon wafer 101 to be a supporting substrate of the SOI wafer and that of the silicon wafer 102 to be an element forming layer of the SOI wafer are both in contact with the bottom surface 160b of one of the recesses 160. Further, as shown in FIG. 39, the side surface of the silicon wafer 101 and that of the silicon wafer 102 are both in contact with the side surface 163s of one of the recesses 163. Therefore, each side surface of the silicon wafers 101 and 102 receives a scratch due to the contact with the recesses 160 and 163, so that scratch receiving parts 125a and 125b are formed, as shown in FIG. 40.

The scratch receiving part 125a formed on the silicon wafer 102 is removed in the process of making the silicon wafer 102 into a thin film, as shown in FIG. 41. However, the scratch receiving part 125b formed on the silicon wafer 101 is not removed in that process and thus remains on an SOI wafer 127 finally manufactured. The scratch receiving part 125b causes a reduction of toughness of the SOI wafer 127, resulting in a problem in that the scratch receiving part 125b causes a heat crack in the SOI wafer 127 during the process of forming a semiconductor element in an element forming layer 126 of the SOI wafer 127.

Moreover, the laminated wafers 150 are supported only by the wafer supporting parts 158 and 161 of the boats 151 and 154, which causes the self weight of the laminated wafers 150 to concentrate on contact parts with the wafer supporting parts 158 and 161, resulting in an occurrence of a slip dislocation. In particular, the laminated wafers 150 each including two silicon wafers 101 and 102 have such a great weight that the occurrence of the slip dislocation is promoted. The slip dislocation also causes a reduction of toughness of the SOI wafer 127 similarly to the above-described scratch receiving part 125b, which results in the problem as described above.

SUMMARY OF THE INVENTION

A first aspect of the present invention is directed to a method of manufacturing an SOI wafer. The method comprises the steps of: (a) preparing a first semiconductor wafer to be a supporting substrate of the SOI wafer and a second semiconductor wafer to be an element forming layer of the SOI wafer; (b) bonding the first and the second semiconductor wafers to each other with an insulation layer interposed therebetween, thereby forming a laminated wafer; (c) preparing a boat supporting the laminated wafer; (d) mounting the laminated wafer on the boat in the state that at least a side surface of the first semiconductor wafer is not in contact with the boat; and (e) conducting heat treatment for improving bonding strength between the first and the second semiconductor wafers, the step (e) being executed after the step (d).

According to a second aspect of the present invention, in the method of manufacturing an SOI wafer of the first aspect, the first semiconductor wafer has a first main surface which is in contact with the insulation layer and a second main surface which is not in contact with the insulation layer, and in the step (d), the laminated wafer is mounted on the boat in the state that the side surface and the second main surface of the first semiconductor wafer are not in contact with the boat.

According to a third aspect of the present invention, in the method of manufacturing an SOI wafer of the first aspect, the boat prepared in the step (c) is provided with a recess having a first bottom surface and a second bottom surface placed in a position lower than the first bottom surface, and in the step (d), the laminated wafer is mounted on the boat in the state that a side surface of the second semiconductor wafer is in contact with the first bottom surface, and the side surface of the first semiconductor wafer is not in contact with the second bottom surface. The method further comprises the step of (f) forming the element forming layer of the SOI wafer by removing a surface of the second semiconductor wafer, the step (f) being executed after the step (e).

According to a fourth aspect of the present invention, in the method of manufacturing an SOI wafer of the third aspect, the first bottom surface of the recess provided for the boat prepared in the step (c) has a width in the direction that the first and the second semiconductor wafers are laminated which is smaller than a thickness of the second semiconductor wafer.

According to a fifth aspect of the present invention, in the method of manufacturing an SOI wafer of the first or second aspect, the boat prepared in the step (c) is provided with a recess having a first side surface and a second side surface placed in a position deeper than the first side surface, and in the step (d), the laminated wafer is mounted on the boat in the state that a side surface of the second semiconductor wafer is in contact with the first side surface, and a side surface of the first semiconductor wafer is not in contact with the second side surface. The method further comprises the step of (f) forming the element forming layer of the SOI wafer by removing a surface of the second semiconductor wafer, the step (f) being executed after the step (e).

According to a sixth aspect of the present invention, in the method of manufacturing an SOI wafer of the fifth aspect, the first side surface of the recess provided for the boat prepared in the step (c) has a height in the direction that the first and the second semiconductor wafers are laminated which is smaller than a thickness of the second semiconductor wafer.

According to a seventh aspect of the present invention in the method of manufacturing an SOI wafer of the first or second aspect, the second semiconductor wafer prepared in the step (a) has a diameter greater than that of the first semiconductor wafer, the boat prepared in the step (c) is provided with a predetermined recess, and in the step (d), the laminated wafer is mounted on the boat in the state that the second semiconductor wafer is inserted into the recess, and the first semiconductor wafer is not inserted into the recess. The method further comprises the step of (f) forming the element forming layer of the SOI wafer by removing a surface of the second semiconductor wafer, the step (f) being executed after the step (e).

According to an eighth aspect of the present invention, the method of manufacturing an SOI wafer of the first aspect further comprises the step of (f) forming a protective film at least on the side surface of the first semiconductor wafer, the step (f) being executed before the step (d).

According to a ninth aspect of the present invention, in the method of manufacturing an SOI wafer of the eighth aspect, the first semiconductor wafer includes a plurality of first semiconductor wafers, and the step (f) includes the steps of: (f-1) laminating the plurality of first semiconductor wafers, thereby forming a laminated structure; (f-2) forming the protective film on a surface of the laminated structure; and (f-3) separating the laminated structure into each one of the plurality of first semiconductor wafers, the step (f-3) being executed after the step (f-2).

According to a tenth aspect of the present invention, in the method of manufacturing an SOI wafer of the eighth aspect, the first semiconductor wafer has a first main surface which is in contact with the insulation layer and a second main surface which is not in contact with the insulation layer, and in the step (f), the protective film is formed on the side surface and the second main surface of the first semiconductor wafer.

According to an eleventh aspect of the present invention, in the method of manufacturing an SOI wafer of the tenth aspect, the first semiconductor wafer includes two first semiconductor wafers, and the step (f) includes the steps of: (f-1) laminating the two first semiconductor wafers with their first main surfaces being in contact with each other, thereby forming a laminated structure; (f-2) forming the protective film on a surface of the laminated structure; and (f-3) separating the laminated structure into each one of the two first semiconductor wafers, the step (f-3) being executed after the step (f-2).

According to a twelfth aspect of the present invention, in the method of manufacturing an SOI wafer of the first or second aspect, the second semiconductor wafer has a first main surface which is in contact with the insulation layer and a second main surface which is not in contact with the insulation layer, the boat prepared in the step (c) includes a wafer supporting part with a plurality of projections formed thereon, and in the step (d), the laminated wafer is placed on the wafer supporting part in the state that the plurality of projections and the second main surface of the second semiconductor wafer are in contact with each other.

A thirteenth aspect of the present invention is directed to a method of manufacturing an SOI wafer. The method comprises the steps of: (a) preparing a first semiconductor wafer to be a supporting substrate of the SOI wafer having first and second main surfaces and a second semiconductor wafer to be an element forming layer of the SOI wafer having first and second main surfaces; (b) bonding the first and the second semiconductor wafers to each other with an insulation layer interposed between the first main surfaces of the first and the second semiconductor wafers, thereby forming a laminated wafer; (c) mounting the laminated wafer on a wafer mount surface in the state that the second main surface of the second semiconductor wafer is in contact with the wafer mount surface; and (d) conducting heat treatment for improving bonding strength between the first and the second semiconductor wafers, the step (d) being executed after the step (c).

According to a fourteenth aspect of the present invention, in the method of manufacturing an SOI wafer of the thirteenth aspect, the wafer mount surface is defined on a conveyor belt, and in the step (d), the conveyor belt is moved under a heater to heat the laminated wafer by the heater, thereby conducting the heat treatment.

According to a fifteenth aspect of the present invention, in the method of manufacturing an SOI wafer of the thirteenth aspect, the wafer mount surface is defined on a hot plate, and in the step (d), the laminated wafer is heated by the hot plate, thereby conducting the heat treatment.

According to a sixteenth aspect of the present invention, the method of manufacturing an SOI wafer of any one of the thirteenth to fifteenth aspects further comprises the step of (e) forming the element forming layer of the SOI wafer by removing a surface of the second semiconductor wafer, the step (e) executed after the step (d).

A seventeenth aspect of the present invention is directed to a method of manufacturing an SOI wafer. The method comprises the steps of: (a) preparing a first semiconductor wafer to be a supporting substrate of the SOI wafer and a second semiconductor wafer to be an element forming layer of the SOI wafer; (b) bonding the first and the second semiconductor wafers to each other with an insulation layer interposed therebetween, thereby forming a laminated wafer; (c) preparing a boat supporting the laminated wafer; (d) mounting the laminated wafer on the boat in the state that the first semiconductor wafer and the boat are in contact with each other; (e) conducting heat treatment for improving bonding strength between the first and the second semiconductor wafers, the step (e) being executed after the step (d); and (f) removing a scratch receiving part formed in a contact part between the first semiconductor wafer and the boat, the step (f) being executed after the step (e).

According to an eighteenth aspect of the present invention, in the method of manufacturing an SOI wafer of the seventeenth aspect, in the step (d), the laminated wafer is mounted on the boat in the state that the first and the second semiconductor wafers are in contact with the boat. The method further comprises the step of (g) forming the element forming layer of the SOI wafer by removing a surface of the second semiconductor wafer, the step (g) being executed after the step (e).

With the method of the first aspect of the invention, it is possible to avoid a scratch and a slip dislocation resulting from the contact with the boat from occurring in the side surface of the first semiconductor wafer. As a result, in the process of forming a semiconductor element in the element forming layer of the SOI wafer, occurrence of a heat crack in the SOI wafer can be suppressed, which allows an increase in yields.

With the method of the second aspect of the invention, it is possible to avoid a scratch and a slip dislocation resulting from the contact with the boat from occurring in the side surface and the second main surface of the first semiconductor wafer. As a result, in the process of forming a semiconductor element in the element forming layer of the SOI wafer, occurrence of a heat crack in the SOI wafer can be suppressed, which allows an increase in yields.

With the method of the third aspect of the invention, the side surface of the first semiconductor wafer is not in contact with the second bottom surface of the recess in the state that the laminated wafer is mounted on the boat. Therefore, it is possible to avoid a scratch and a slip dislocation resulting from the contact with the boat from occurring in the side surface of the first semiconductor wafer. Further, since the surface of the second semiconductor wafer is removed in the step (f), the SOI wafer as a final product has no scratch or slip dislocation remained therein, even if such a scratch or a slip dislocation occurs in the surface of the second semiconductor wafer when mounting the laminated wafer on the boat.

With the method of the fourth aspect of the invention, the first bottom surface of the recess has the width smaller than the thickness of the second semiconductor wafer. This effectively prevents the first bottom surface of the recess from being in contact with the side surface of the first semiconductor wafer in the state that the laminated wafer is mounted on the boat.

With the method of the fifth aspect of the invention, the side surface of the first semiconductor wafer is not in contact with the second side surface of the recess in the state that the laminated wafer is mounted on the boat. Therefore, it is possible to avoid a scratch and a slip dislocation resulting from the contact with the boat from occurring in the side surface of the first semiconductor wafer. Further, since the surface of the second semiconductor wafer is removed in the step (f), the SOI wafer as a final product has no scratch or slip dislocation remained therein, even if such a scratch or a slip dislocation occurs in the surface of the second semiconductor wafer when mounting the laminated wafer on the boat.

With the method of the sixth aspect of the invention, the first side surface of the recess has the height smaller than the thickness of the second semiconductor wafer. This effectively prevents the first side surface of the recess from being in contact with the side surface of the first semiconductor wafer in the state that the laminated wafer is mounted on the boat.

With the method of the seventh aspect of the invention, the first semiconductor wafer is not inserted into the recess of the boat in the state that the laminated wafer is mounted on the boat. Therefore, it is possible to avoid a scratch and a slip dislocation resulting from the contact with the boat from occurring in the side surface of the first semiconductor wafer. Further, since the surface of the second semiconductor wafer is removed in the step (f), the SOI wafer as a final product has no scratch or slip dislocation remained therein, even if such a scratch or a slip dislocation occurs in the surface of the second semiconductor wafer when mounting the laminated wafer on the boat.

With the method of the eighth aspect of the invention, the protective film is formed at least on the side surface of the first semiconductor wafer, so that the side surface of the first semiconductor wafer is not in direct contact with the boat in the state that the laminated wafer is mounted on the boat. Therefore, it is possible to avoid a scratch and a slip dislocation resulting from the contact with the boat from occurring in the side surface of the first semiconductor wafer.

With the method of the ninth aspect of the invention, the first semiconductor wafers having the protective film formed on their side surfaces can be formed by a relatively easy method.

With the method of the tenth aspect of the invention, the protective film is formed on the side surface and the second main surface of the first semiconductor wafer, so that the side surface and the second main surface of the first semiconductor wafer are not in direct contact with the boat in the state that the laminated wafer is mounted on the boat. Therefore, it is possible to avoid a scratch and a slip dislocation resulting from the contact with the boat from occurring in the side surface and the second main surface of the first semiconductor wafer.

With the method of the eleventh aspect of the invention, the first semiconductor wafers having the protective film formed on their side surfaces and second main surfaces can be formed by a relatively easy method.

With the method of the twelfth aspect of the invention, the side surface and the second main surface of the first semiconductor wafer are not in contact with the projections of the wafer supporting part in the state that the laminated wafer is mounted on the boat. Therefore, it is possible to avoid a scratch and a slip dislocation resulting from the contact with the boat from occurring in the side surface and the second main surface of the first semiconductor wafer.

With the method of the thirteenth aspect of the invention, the side surface and the second main surface of the first semiconductor wafer are not in contact with the wafer mount surface in the state that the laminated wafer is mounted on the wafer mount surface. Therefore, it is possible to avoid a scratch and a slip dislocation resulting from the contact with the boat from occurring in the side surface and the second main surface of the first semiconductor wafer.

With the method of the fourteenth aspect of the invention, heat treatment for improving the bonding strength between the first and the second semiconductor wafers can be conducted by a relatively easy device structure using the heater and the conveyor belt.

With the method of the fifteenth aspect of the invention, heat treatment for improving the bonding strength between the first and the second semiconductor wafers can be conducted by a relatively easy device structure using the hot plate.

With the method of the sixteenth aspect of the invention, since the surface of the second semiconductor wafer is removed in the step (e), the SOI wafer as a final product has no scratch or slip dislocation remained therein, even if such a scratch or a slip dislocation occurs in the surface of the second semiconductor wafer when mounting the laminated wafer on the wafer mount surface.

With the method of the seventeenth aspect of the invention, after obtaining the laminated wafer having the scratch receiving part formed resulting from the contact with the boat, the scratch receiving part of the first semiconductor wafer is removed in the step (f). Therefore, in the process of forming a semiconductor element in the element forming layer of the SOI wafer, occurrence of a heat crack in the SOI wafer can be suppressed, which allows an increase in yields.

With the method of the eighteenth aspect of the invention, since the surface of the second semiconductor wafer is removed in the step (g), the SOI wafer as a final product has no scratch receiving part remained therein, even if such a scratch receiving part formed in the surface of the second semiconductor wafer when mounting the laminated wafer on the boat.

An object of the present invention is to provide a method of manufacturing an SOI wafer capable of avoiding occurrence of a scratch and a slip dislocation in a supporting substrate that cause a heat crack in the SOI wafer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a sectional view showing a step of a method of manufacturing an SOI wafer according to a third preferred embodiment of the invention;

FIGS. 13 and 14 show a method of manufacturing an SOI wafer according to a fourth preferred embodiment of the invention in sequential order;

FIGS. 21 and 22 show a method of manufacturing an SOI wafer according to a sixth preferred embodiment of the invention in sequential order;

FIG. 23 shows a step of a method of manufacturing an SOI wafer according to a seventh preferred embodiment of the invention;

DESCRIPTION OF THE PREFERRED EMBODIMENTS

First Preferred Embodiment

Figure 1:
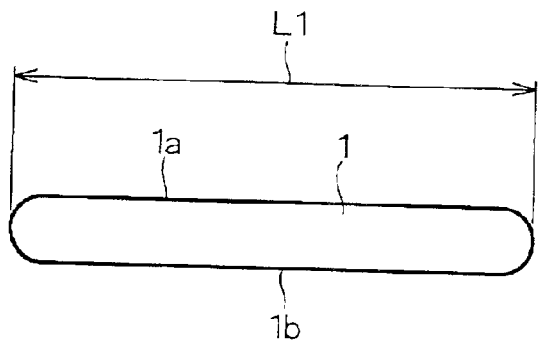
FIGS. 1 through 7 show a method of manufacturing an SOI wafer according to a first preferred embodiment of the invention in sequential order.
Figure 2:
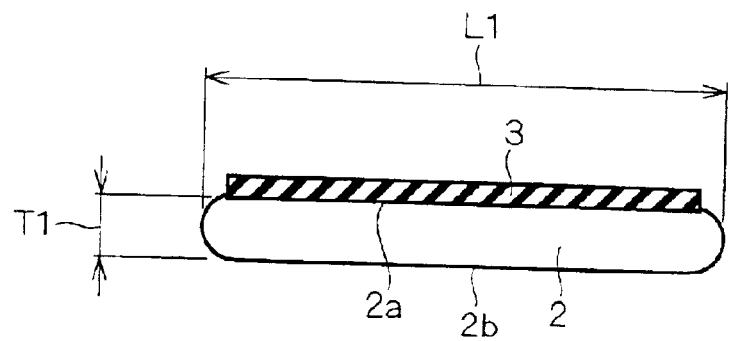

FIGS. 1 through 7 show a method of manufacturing an SOI wafer according to the first preferred embodiment of the present invention in sequential order. Referring to FIG. 1, prepared first is a silicon wafer 1 which is finally to be a supporting substrate of the SOI wafer. The silicon wafer 1 has a first main surface 1a and a second main surface 1b. As shown in FIG. 1, the silicon wafer 1 has a diameter L1 (e.g., 200 mm). Referring to FIG. 2, prepared further is a silicon wafer 2 which is finally to be an element forming layer of the SOI wafer. The silicon wafer 2 has a first main surface 2a and a second main surface 2b. An insulation layer 3 made of a silicon oxide film is formed on the first main surface 2a of the silicon wafer 2. The insulation layer 3 may be formed not only on the first main surface 2a but also on the entire surface of the silicon wafer 2. As shown in FIG. 2, the silicon wafer 2 has the same diameter L1 as the silicon wafer 1 and a thickness T1 (e.g., 725 µm).

Figure 3:
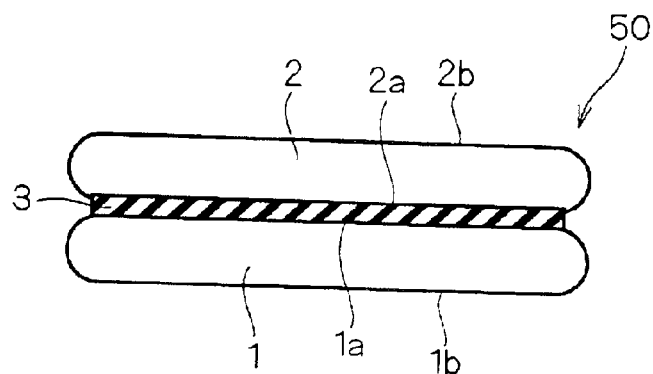

Next, referring to FIG. 3, the silicon wafers 1 and 2 are bonded to each other with the insulation layer 3 interposed therebetween, thereby forming a laminated wafer 50 in which the silicon wafer 1, the insulation layer 3 and the silicon wafer 2 are laminated in this order. The first main surface 1a of the silicon wafer 1 is in contact with the insulation layer 3.

Figure 4:
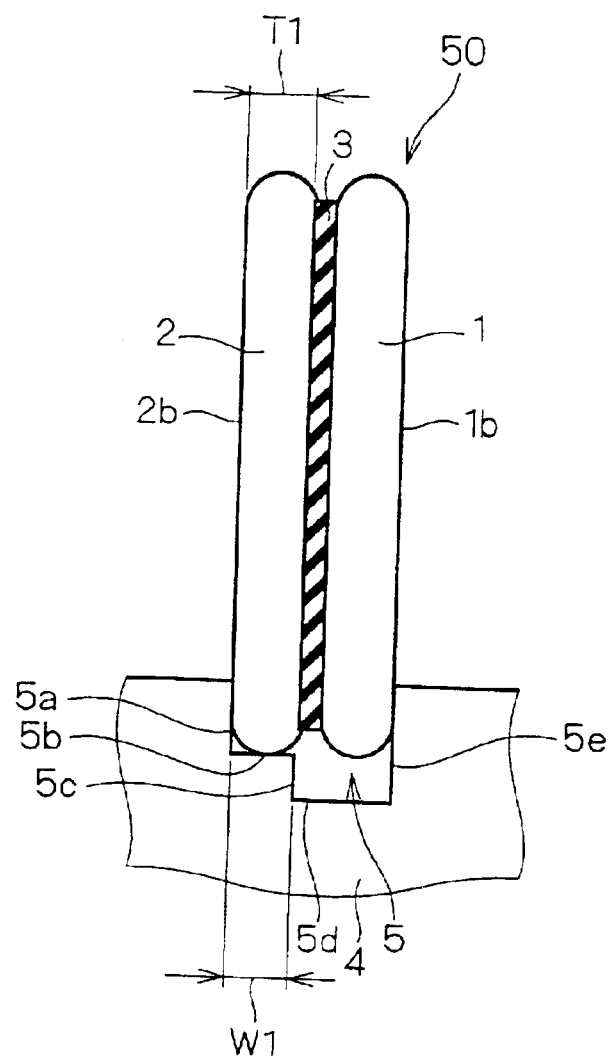

Next, to improve the bonding strength between the silicon wafers 1 and 2, heat treatment (anneal at about 1000° C.) is conducted. FIG. 4 is a sectional view showing the state in which the laminated wafer 50 is mounted on a boat 4 in the case of using a horizontal diffusion furnace. The boat 4 is provided with a recess 5 for supporting the laminated wafer 50. The recess 5 has a first side surface 5a, a first bottom surface 5b, a second side surface 5c, a second bottom surface 5d and a third side surface 5e. Viewing from an upper surface of the boat 4, the second bottom surface 5d is located in a position lower than the first bottom surface 5b. The laminated wafer 50 is mounted on the boat 4 in such a manner that the side surface of the silicon wafer 2 is in contact with the first bottom surface 5b of the recess 5 and the side surface of the silicon wafer 1 is not in contact with the second bottom surface 5d of the recess 5. Further, the second main surface 2b of the silicon wafer 2 is in contact with the first side surface 5a of the recess 5, and the second main surface 1b of the silicon wafer 1 is in contact with the third side surface 5e of the recess 5. A width W1 of the first bottom surface 5b of the recess 5 in the direction that the silicon wafers 1 and 2 are laminated (the left-to-right direction of the sheet of drawing) is smaller than the thickness T1 of the silicon wafer 2.

Figure 5:
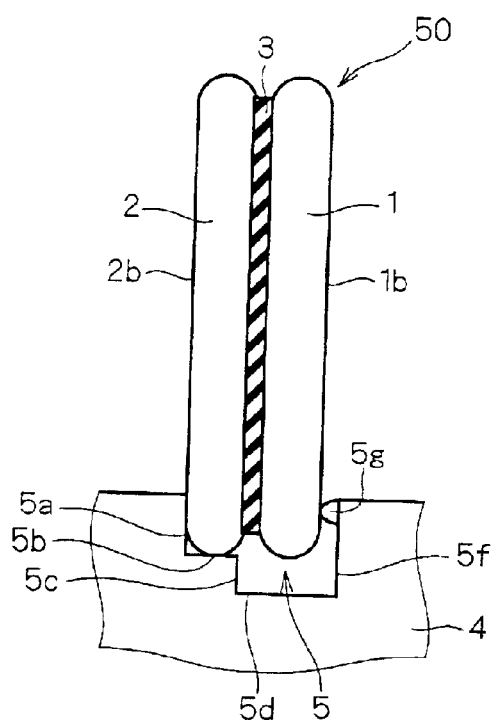

FIG. 5 is a sectional view showing another structure of the boat 4. The recess 5 has a third side surface 5f which is not in contact with the second main surface 1b of the silicon wafer 1 instead of the third side surface 5e which is in contact with the second main surface 1b of the silicon wafer 1. A projection 5g is provided on the third side surface 5f of the recess 5. The second main surface 1b of the silicon wafer 1 is in contact with the projection 5g.

Figure 6:
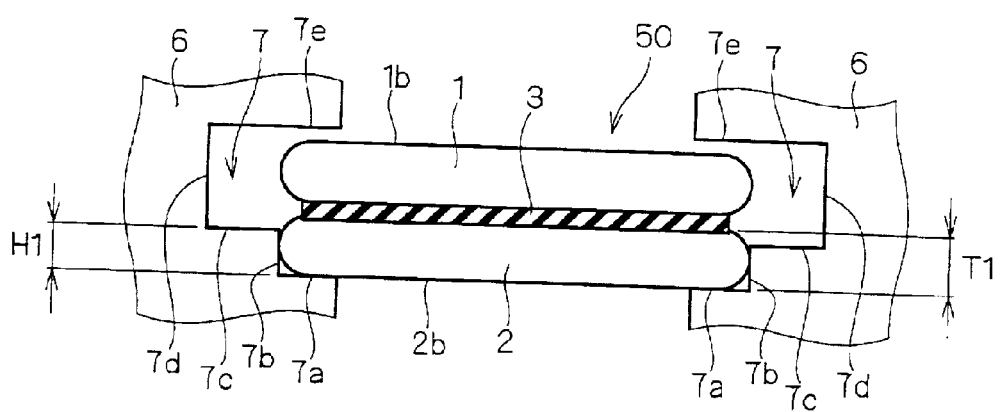

FIG. 6 is a sectional view showing the state in which the laminated wafer 50 is mounted on a boat 6 in the case of using a vertical diffusion furnace. The boat 6 is provided with a recess 7 for supporting the laminated wafer 50. The recess 7 has a first bottom surface 7a, a first side surface 7b, a second bottom surface 7c, a second side surface 7d and an upper surface 7e. Viewing from a side surface of the boat 6, the second side surface 7d is located in a position deeper than the first side surface 7b. The laminated wafer 50 is mounted on the boat 6 in such a manner that the side surface of the silicon wafer 2 is in contact with the first side surface 7b of the recess 7, and the side surface of the silicon wafer 1 is not in contact with the second side surface 7d of the recess 7. Further, the second main surface 2b of the silicon wafer 2 is in contact with the first bottom surface 7a of the recess 7, and the second main surface 1b of the silicon wafer 1 is not in contact with the upper surface 7e of the recess 7. A height H1 of the first side surface 7b of the recess 7 in the direction that the silicon wafers 1 and 2 are laminated (the top-to-bottom direction of the sheet of drawing) is smaller than the thickness T1 of the silicon wafer 2.

The boats 4 and 6 with a plurality of laminated wafers 50 mounted thereon are transferred into a quartz tube of the diffusion furnace, where the laminated wafers 50 are heated by a heater provided around the quartz tube. Heat treatment is thereby conducted for improving the bonding strength between the silicon wafers 1 and 2.

Figure 7:
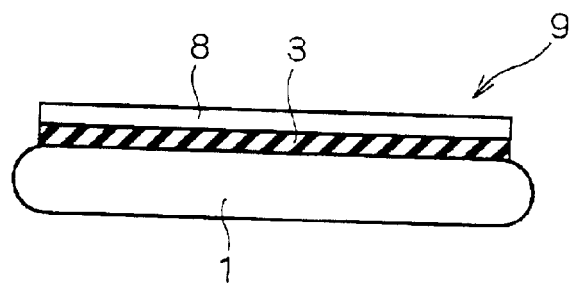
Figure 8:
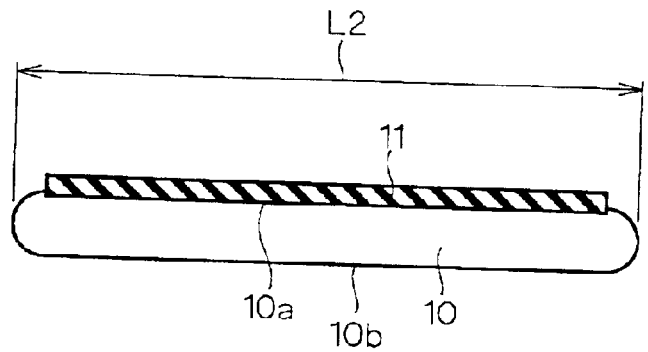
FIGS. 8 through 11 show a method of manufacturing an SOI wafer according to a second preferred embodiment of the invention in sequential order.
Figure 9:
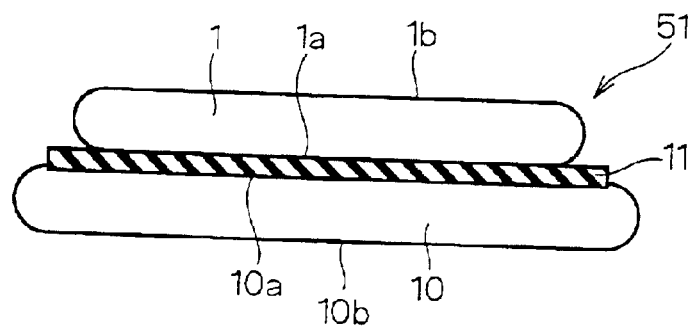

After conducting the heat treatment, the chemical-mechanical polishing or the like mentioned in the Description of the Background Art is used to make the silicon wafer 2 into a thin film from the side of the second main surface 2b. Accordingly, an element forming layer 8 made of silicon is formed and an SOI wafer 9 is completed as shown in FIG. 7. When it is desired that the element forming layer 8 should have a thickness of 0.2 µm in the case where the silicon wafer 2 has a thickness of 725 µm, the thickness of the silicon wafer 2 may be reduced by 724.8 µm.

As has been described, in the method of manufacturing the SOI wafer according to the present embodiment, as shown in FIGS. 4 to 6, the side surface of the silicon wafer 1 is not in contact with the boat 4 or 6 with the laminated wafer 50 mounted on the boat 4 or 6. Therefore, it is possible to avoid a scratch and the slip dislocation resulting from the contact with the boat from occurring in the side surface of the silicon wafer 1. As a result, in the process of forming a semiconductor element in the element forming layer 8 of the SOI wafer 9, occurrence of a heat crack in the SOI wafer 9 can be suppressed, which allows an increase in yields.

Second Preferred Embodiment

FIGS. 8 through 11 show a method of manufacturing an SOI wafer according to the second preferred embodiment of the present invention in sequential order. Prepared first is the silicon wafer 1 shown in FIG. 1, and referring to FIG. 8, a silicon wafer 10 which is finally to be an element forming layer of the SOI wafer. The silicon wafer 10 has a first main surface 10a and a second main surface 10b. An insulation layer 11 made of a silicon oxide film is formed on the first main surface 10a of the silicon wafer 10. The silicon wafer 10 has a diameter L2 greater than the diameter L1 of the silicon wafer 1. Next, referring to FIG. 9, the silicon wafers 1 and 10 are bonded to each other with the insulation layer 11 interposed therebetween, thereby forming a laminated wafer 51 in which the silicon wafer 1, the insulation layer 11 and the silicon wafer 10 are laminated in this order.

Figure 10:
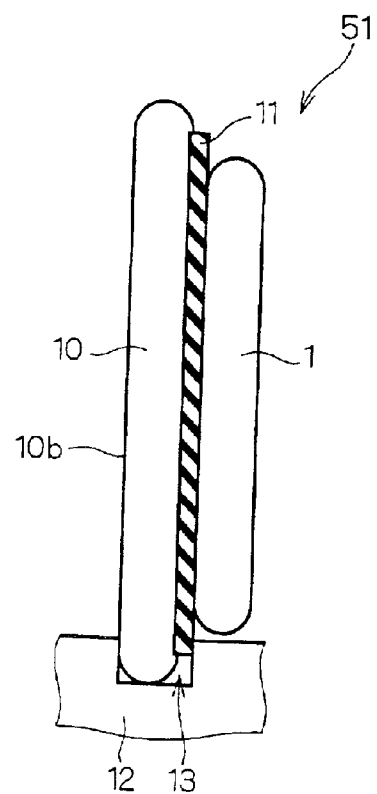

Next, to improve the bonding strength between the silicon wafers 1 and 10, heat treatment is conducted. FIG. 10 is a sectional view showing the state in which the laminated wafer 51 is mounted on a boat 12 in the case of using the horizontal furnace. The boat 12 is provided with a recess 13 for supporting the laminated wafer 51. The laminated wafer 51 is mounted on the boat 12 in such a manner that a side surface of the silicon wafer 10 is in contact with a bottom surface of the recess 13, and the side surface of the silicon wafer 1 is not in contact with the boat 12. The second main surface 10b of the silicon wafer 10 and the insulation layer 11 are in contact with respective side surfaces of the recess 13. In other words, the silicon wafer 10 is inserted into the recess 13, so that the laminated wafer 51 is supported by the boat 12.

The diameter L2 of the silicon wafer 10 is set in such a size that can prevent the silicon wafer 1 and the boat 12 from being in contact with each other when the laminated wafer 51 is mounted on the boat 12. For instance, the diameter L1 of the silicon wafer 1 shall be 200 mm, and the recess 13 shall have a depth of 5 mm. When the silicon wafers 1 and 10 are bonded with their centers aligned to each other, the diameter L2 of the silicon wafer 10 is set in a value greater than 200+5×2=210 mm. On the other hand, when the silicon wafer 1 is bonded in a state shifted to one edge of the silicon wafer 10, for example, when upper edges of the silicon wafers 1 and 10 are aligned in FIG. 10, a lower edge of the silicon wafer 10 is inserted into the recess 13, and at this time, the diameter L2 of the silicon wafer 10 is set in a value greater than 200+5=205 mm.

Figure 11:
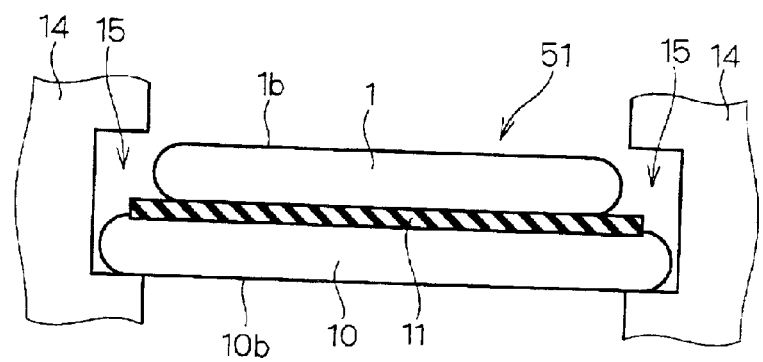

FIG. 11 is a sectional view showing the state in which the laminated wafer 51 is mounted on a boat 14 in the case of using the vertical furnace. The boat 14 is provided with a recess 15 for supporting the laminated wafer 51. The laminated wafer 51 is mounted on the boat 14 in such a manner that the second main surface 10b of the silicon wafer 10 is in contact with a bottom surface of the recess 15. Neither the side surface nor the second main surface 1b of the silicon wafer 1 is in contact with the boat 14.

The boats 12 and 14 with a plurality of laminated wafers 51 mounted thereon are transferred into a quartz tube of the diffusion furnace, where the laminated wafers 51 are heated by a heater provided around the quartz tube. Heat treatment is thereby conducted for improving the bonding strength between the silicon wafers 1 and 10. After conducting the heat treatment, the aforementioned chemical-mechanical polishing or the like is used to make the silicon wafer 10 into a thin film from the side of the second main surface 10b. Accordingly, the element forming layer 8 is formed and the SOI wafer 9 is completed as shown in FIG. 7.

As has been described, in the method of manufacturing the SOI wafer according to the present embodiment, as shown in FIGS. 10 and 11, neither the side surface nor the second main surface 1b of the silicon wafer 1 is in contact with the boat 12 or 14 in the state that the laminated wafers 51 are mounted on the boat 12 or 14. Therefore, it is possible to avoid a scratch and a slip dislocation resulting from the contact with the boats from occurring in the side surface and the second main surface 1b of the silicon wafer 1. As a result, in the process of forming a semiconductor element in the element forming layer 8 of the SOI wafer 9, occurrence of a heat crack in the SOI wafer 9 can be suppressed, which allows an increase in yields.

Third Preferred Embodiment

FIG. 12 is a sectional view showing a step of a method of manufacturing an SOI wafer according to the third preferred embodiment of the present invention. After obtaining the structure shown in FIG. 3 through the same steps as in the above first preferred embodiment, a silicon oxide film 16 is formed on the surface of the laminated wafer 50 at or below 400° C. The silicon oxide film 16 has a thickness equal to or greater than 10 nm. As shown in FIG. 12, the silicon oxide film 16 is also formed on the side surface and the second main surface 1b of the silicon wafer 1, thereby serving as a protective film of the silicon wafer 1.

Among methods of forming an oxide film at or below 400° C., there are known: thermal oxidation under a low pressure using a gas mixture of $SiH_4$ and $N_2O$ or that of $SiH_4$, $N_2O$ and $NH_3$ as a source; RF plasma CVD using an organic silane gas such as TEOS as a source; bias ECR plasma CVD or helicon plasma CVD using an inorganic silane gas such as $SiH_4$ as a source; and photo-assisted CVD by low-pressure thermal oxidation under illumination of a low-pressure mercury lamp using a $SiH_4$ gas as a source.

Figure 37:
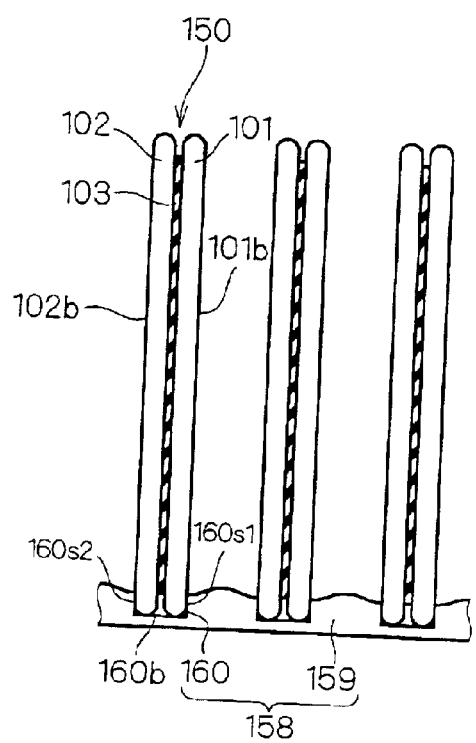
Figure 38:
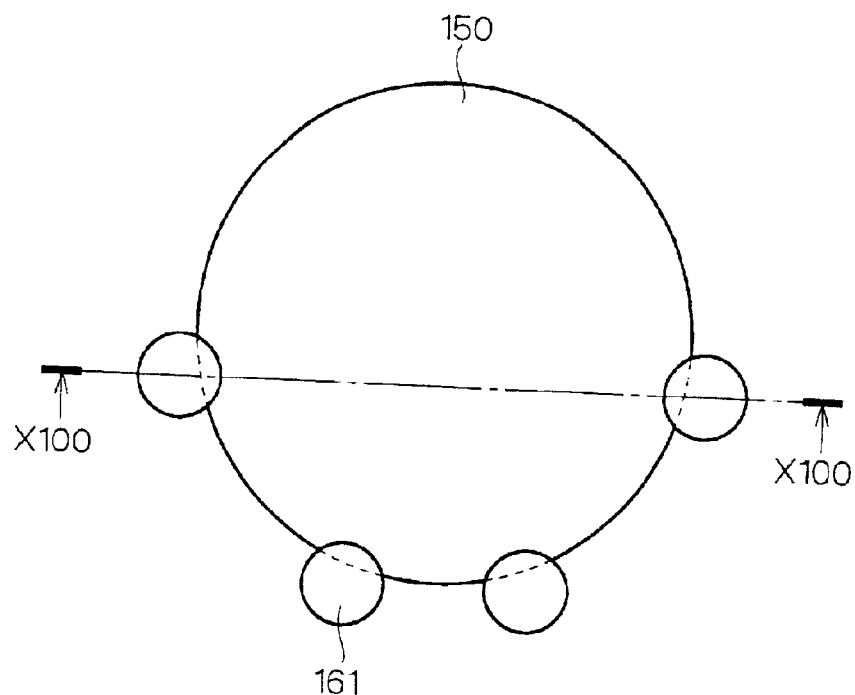
Figure 39:
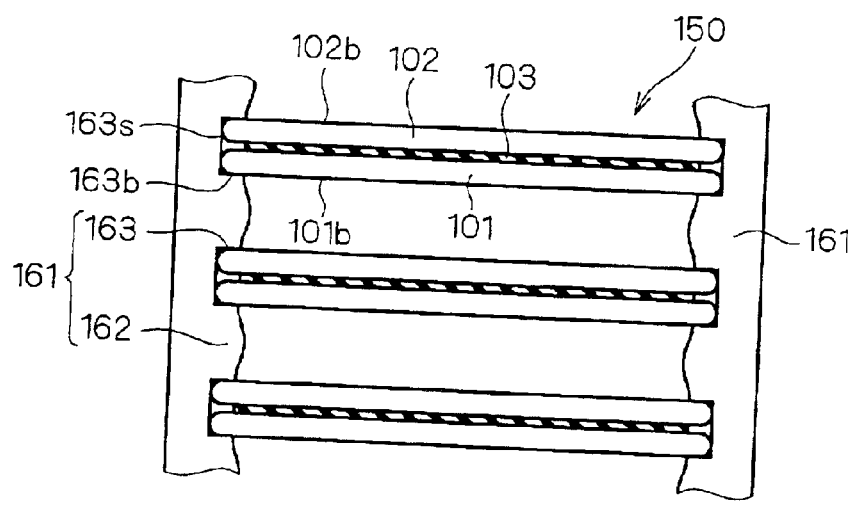
Figure 40:
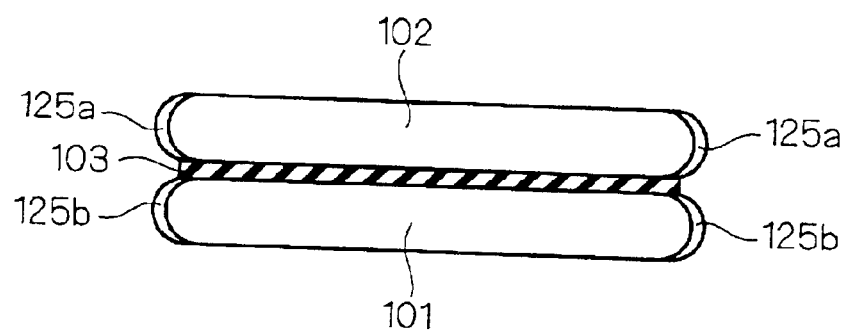
FIGS. 40 and 41 are explanatory views showing a problem in the conventional method of manufacturing an SOI wafer.
Figure 41:
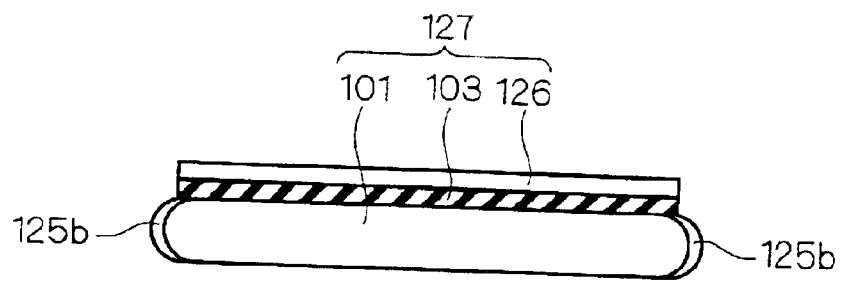

Thereafter, the structure shown in FIG. 12 is mounted on the conventional boats 151 and 154 shown in FIGS. 37 and 39 to conduct heat treatment for improving the bonding strength between the silicon wafers 1 and 2. After conducting the heat treatment, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

As has been described, in the method of manufacturing the SOI wafer according to the present embodiment, the silicon oxide film 16 serving as a protective film is formed on the side surface and the second main surface 1b of the silicon wafer 1, and the laminated wafer 50 is mounted on the boat 151 or 154 with the protective film formed thereon. Thus, it is possible to avoid a direct contact between the silicon wafer 1 and the boat 151 or 154. Therefore, it is possible to avoid a scratch and a slip dislocation resulting from the contact with the boat from occurring in the side surface and the second main surface 1b of the silicon wafer 1, so that the same effect as the second preferred embodiment can be obtained.

Fourth Preferred Embodiment

FIGS. 13 and 14 show a method of manufacturing an SOI wafer according to the fourth preferred embodiment of the present invention in sequential order. The silicon wafer 1 shown in FIG. 1 is first prepared, and a silicon oxide film 17 having a thickness equal to or greater than 10 nm is formed on the side surface of the silicon wafer 1 as shown in FIG. 13. The silicon oxide film 17 serves as a protective film of the side surface of the silicon wafer 1.

Next, referring to FIG. 14, the silicon wafer 1 shown in FIG. 13 and the silicon wafer 2 shown in FIG. 2 are bonded to each other with the insulation layer 3 interposed therebetween, thereby forming a laminated wafer 52 in which the silicon wafer 1, the insulation layer 3 and the silicon wafer 2 are laminated in this order.

Thereafter, the laminated wafer 52 with the protective film formed thereon is mounted on the conventional boat 151 or 154 shown in FIG. 37 or 39 to conduct heat treatment for improving the bonding strength between the silicon wafers 1 and 2. After conducting the heat treatment, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

Figure 15:
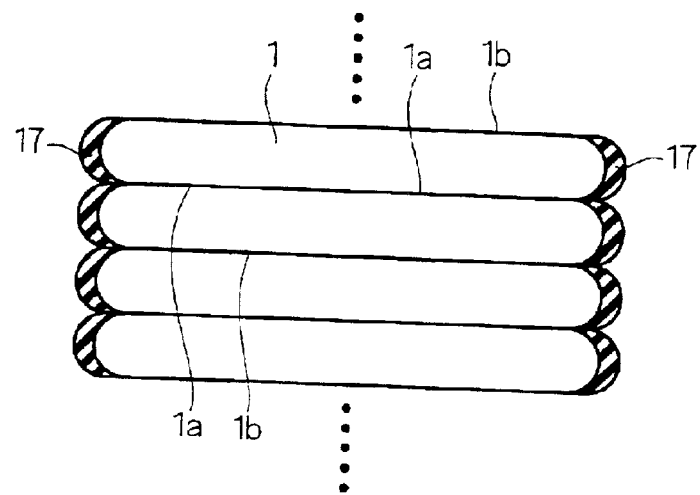
FIGS. 15 and 16 are sectional views showing a method of forming a silicon wafer shown in FIG. 13 in sequential order.
Figure 16:
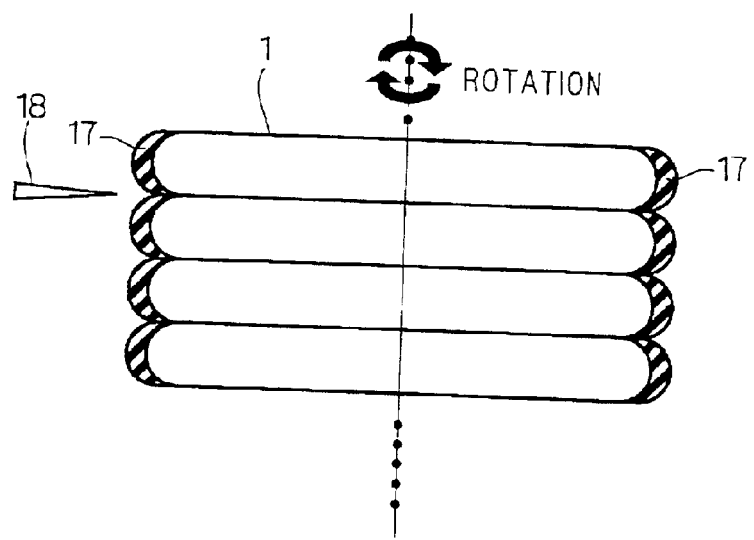

A method of forming the silicon wafer 1 with the silicon oxide film 17 formed on its side surface shown in FIG. 13 will be described hereinafter. FIGS. 15 and 16 are sectional views showing a method of forming the silicon wafer 1 shown in FIG. 13 in sequential order. Plural pieces of silicon wafers 1 shown in FIG. 1 are first prepared, and these silicon wafers 1 are laminated in a block in such a manner that first main surfaces 1a and second main surfaces 1b are in contact with each other, respectively. Next, referring to FIG. 15, the thermal oxidation or CVD is used to form the silicon oxide film 17 on a surface of a structure in which the plurality of silicon wafers 1 are laminated (the structure is hereinafter referred to as "laminated structure").

Next, referring to FIG. 16, while rotating the laminated structure shown in FIG. 15, a hydrofluoric acid vapor 18 is injected into boundaries between the laminated silicon wafers 1. The silicon oxide film 17 around the boundaries is thereby melted by the hydrofluoric acid vapor 18. Alternatively, without injecting the hydrofluoric acid vapor 18, a film that cannot be etched by hydrofluoric acid (e.g., organic resist) may be formed on an area other than the boundaries, and thereafter, only the silicon oxide film 17 around the boundaries may be melted by wet etching using a hydrofluoric acid solution. This applies to a fifth preferred embodiment which will be described later.

Thereafter, a gas which is inert to silicon (e.g., nitrogen or argon) is injected into the above-described boundaries, thereby separating the laminated silicon wafers 1. Through the above steps, the silicon wafer 1 shown in FIG. 13 is formed with the silicon oxide film 17 formed on its side surface.

As has been described, in the method of manufacturing the SOI wafer according to the present embodiment, the silicon oxide film 17 serving as a protective film is formed on the side surface of the silicon wafer 1, and the laminated wafer 52 is mounted on the boat 151 or 154 with the protective film formed thereon. Thus, it is possible to avoid a direct contact between the side surface of the silicon wafer 1 and the boat 151 or 154. Therefore, it is possible to avoid a scratch and a slip dislocation resulting from the contact with the boat from occurring in the side surface of the silicon wafer 1, so that the same effect as the first preferred embodiment can be obtained.

Fifth Preferred Embodiment

Figure 17:
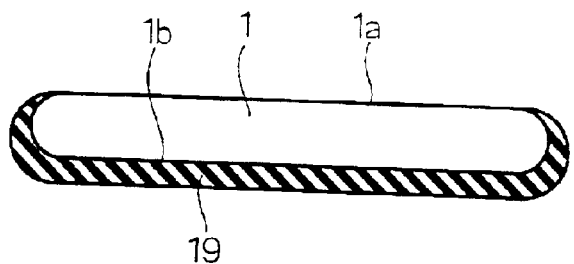
FIGS. 17 and 18 show a method of manufacturing an SOI wafer according to a fifth preferred embodiment of the invention in sequential order.
Figure 18:
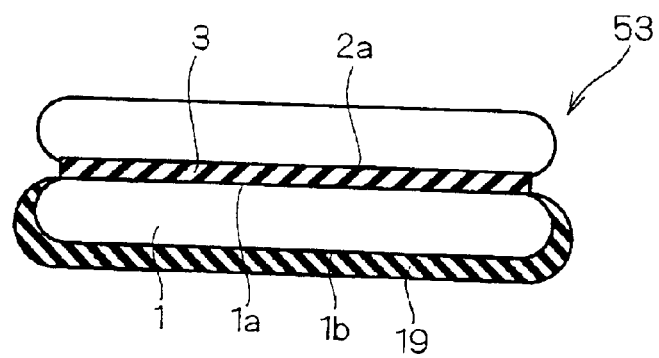

FIGS. 17 and 18 show a method of manufacturing an SOI wafer according to the fifth preferred embodiment of the present invention in sequential order. The silicon wafer 1 shown in FIG. 1 is first prepared, and a silicon oxide film 19 having a thickness equal to or greater than 10 nm is formed on the side surface and the second main surface 1b of the silicon wafer 1 as shown in FIG. 17. The silicon oxide film 19 serves as a protective film of the side surface and the second main surface 1b of the silicon wafer 1.

Next, referring to FIG. 18, the silicon wafer 1 shown in FIG. 17 and the silicon wafer 2 shown in FIG. 2 are bonded to each other with the insulation layer 3 interposed therebetween, thereby forming a laminated wafer 53 in which the silicon wafer 1, the insulation layer 3 and the silicon wafer 2 are laminated in this order.

Thereafter, the laminated wafer 53 with the protective film 19 formed thereon is mounted on the conventional boat 151 or 154 shown in FIGS. 37 and 39 to conduct heat treatment for improving the bonding strength between the silicon wafers 1 and 2. After conducting the heat treatment, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

Figure 19:
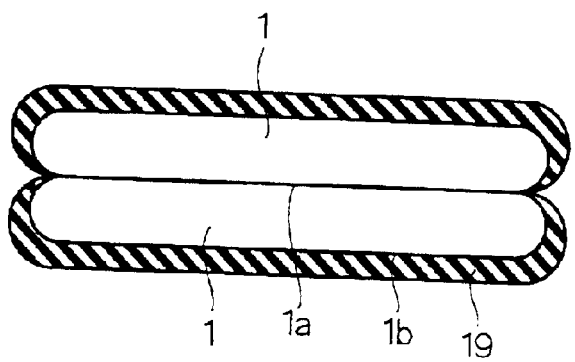
FIGS. 19 and 20 are sectional views showing a method of forming a silicon wafer shown in FIG. 17 in sequential order.
Figure 20:
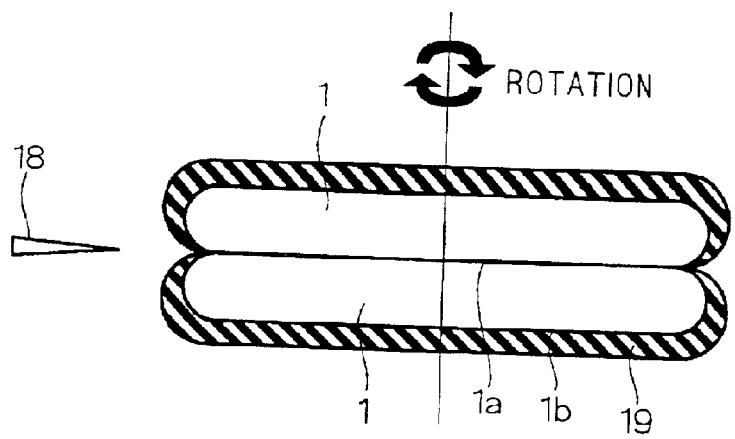

A method of forming the silicon wafer 1 with the silicon oxide film 19 formed on its side surface and second main surface 1b show in FIG. 17 will be described hereinafter. FIGS. 19 and 20 are sectional views showing a method of forming the silicon wafer 1 shown in FIG. 17 in sequential order. Two pieces of silicon wafers 1 shown in FIG. 1 are first prepared, and these silicon wafers 1 are laminated with the first main surfaces 1a being in contact with each other. Next, referring to FIG. 19, the thermal oxidation or CVD is used to form the silicon oxide film 19 on a surface of the laminated structure formed by the two pieces of silicon wafers 1.

Next, referring to FIG. 20, while rotating the laminated structure shown in FIG. 19, hydrofluoric acid vapor 18 is injected into the boundary between the laminated silicon wafers 1. The silicon oxide film 19 around the boundary is thereby melted by the hydrofluoric acid vapor 18. Thereafter, a gas which is inert to silicon is injected into the above-described boundary, thereby separating the laminated silicon wafers 1. The silicon wafer 1 shown in FIG. 17 with the silicon oxide film 19 formed on its side surface and second main surface 1b is formed through the above steps.

As has been described, in the method of manufacturing the SOI wafer according to the present embodiment, the silicon oxide film 19 serving as a protective film is formed on the side surface and the second main 1b surface of the silicon wafer 1, and the laminated wafer 53 is mounted on the boat 151 or 154 with the protective film formed thereon. Thus, it is possible to avoid a direct contact between the side surface and the second main surface 1b of the silicon wafer 1 and the boat 151 or 154. Therefore, it is possible to avoid a scratch and a slip dislocation resulting from the contact with the boat from occurring in the side surface of the silicon wafer 1, so that the same effect as the second preferred embodiment can be obtained.

Sixth Preferred Embodiment

Figure 21:
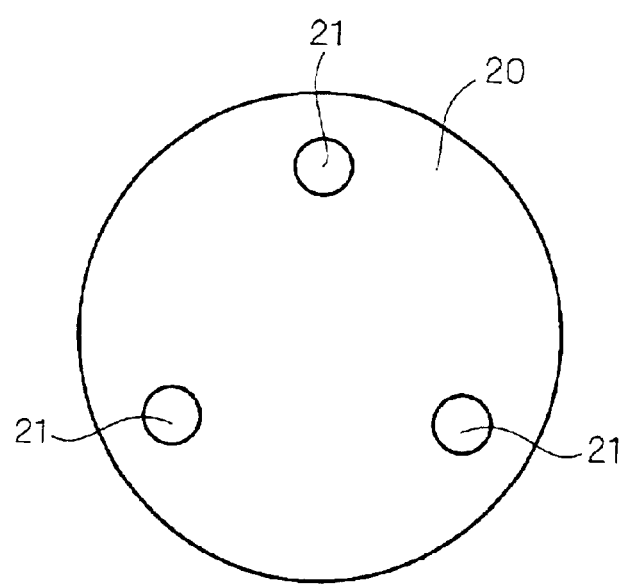

FIGS. 21 and 22 show a method of manufacturing an SOI wafer according to the sixth preferred embodiment of the invention in sequential order. First of all, the laminated wafer 50 shown in FIG. 3 is formed by the same steps as in the first preferred embodiment, while preparing a boat having a disc-like wafer supporting part 20 as shown in FIG. 21. A plurality of projections 21 are formed on the wafer supporting part 20. In the case that the wafer supporting part 20 has three projections 21 as in the example shown in FIG. 21, the three projections 21 are preferably arranged in such positions that they can imaginarily be linked to form a regular triangle.

Next, referring to FIG. 22, the laminated wafer 50 is placed on the wafer supporting part 20 of the boat in the state that the plurality of projections 21 and the second main surface 2b of the silicon wafer 2 are in contact with each other. The projections 21 have semi-spherical shapes and tops of the semi-spheres are in contact with the second main surface 2b of the silicon wafer 2 at positions not less than 1cm away from the edge toward the center of the silicon wafer 2.

Next, after conducting heat treatment for improving the bonding strength between the silicon wafers 1 and 2, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

As has been described, in the method of manufacturing the SOI wafer according to the present embodiment, neither the side surface nor the second main surface 1b of the silicon wafer 1 is in contact with the boat in the state that the laminated wafer 50 is mounted on the boat. Therefore, it is possible to avoid a scratch and a slip dislocation resulting from the contact with the boat from occurring in the side surface and the second main surface 1b of the silicon wafer 1, so that the same effect as the second preferred embodiment can be obtained.

Seventh Preferred Embodiment

FIG. 23 shows a step of a method of manufacturing an SOI wafer according to the seventh preferred embodiment of the present invention. First of all, the laminated wafer 50 shown in FIG. 3 is formed by the same steps as in the first preferred embodiment. Next, referring to FIG. 23, the laminated wafer 50 is placed on a conveyor belt 22 in such a manner that the second main surface 2b of the silicon wafer 2 is in contact with a wafer mount surface of the conveyor belt 22. A heater 23 is provided above a moving path of the conveyor belt 22.

Next, the heater 23 is driven and the conveyor belt 22 is moved, so that the laminated wafer 50 is automatically conveyed under the heater 23. Heat treatment is thereby conducted for improving the bonding strength between the silicon wafers 1 and 2. Thereafter, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

As has been described, in the method of manufacturing the SOI wafer according to the present embodiment, as shown in FIG. 23, neither the side surface nor the second main surface 1b of the silicon wafer 1 is in contact with the conveyor belt 22 in the state that the laminated wafer 50 is placed on the conveyor belt 22. Therefore, it is possible to avoid a scratch and a slip dislocation resulting from the contact with the conveyor belt 22 from occurring in the side surface and the second main surface 1b of the silicon wafer 1, so that the same effect as the second preferred embodiment can be obtained.

Eighth Preferred Embodiment

Figure 24:
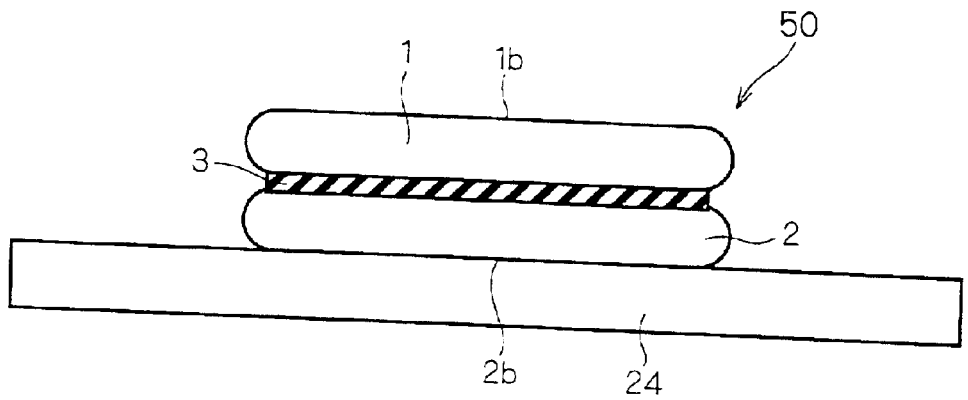
FIG. 24 shows a step of a method of manufacturing an SOI wafer according to an eighth preferred embodiment of the invention.

FIG. 24 shows a step of a method of manufacturing an SOI wafer according to the eighth preferred embodiment of the present invention. First of all, the laminated wafer 50 shown in FIG. 3 is formed by the same steps as in the first preferred embodiment. Next, referring to FIG. 24, the laminated wafer 50 is mounted on a hot plate 24 in such a manner that the second main surface 2b of the silicon wafer 2 is in contact with a wafer mount surface of the hot plate 24. The laminated wafer 50 may be mounted on the hot plate 24 with a ceramic plate interposed therebetween.

Next, the hot plate 24 is driven, thereby conducting heat treatment for improving the bonding strength between the silicon wafers 1 and 2. Thereafter, the aforementioned chemical-mechanical polishing or the like is used to make the silicon wafer 2 into a thin film from the side of the second main surface 2b. Accordingly, the element forming layer 8 is formed and the SOI wafer 9 is completed as shown in FIG. 7.

As has been described, in the method of manufacturing the SOI wafer according to the present embodiment, as shown in FIG. 24, neither the side surface nor the second main surface 1b of the silicon wafer 1 is in contact with the hot plate 24 in the state that the laminated wafer 50 is mounted on the hot plate 24. Therefore, it is possible to avoid a scratch and a slip dislocation resulting from the contact with the hot plate 24 from occurring in the side surface and the second main surface 1b of the silicon wafer 1, so that the same effect as the second preferred embodiment can be obtained.

Ninth Preferred Embodiment

Figure 25:
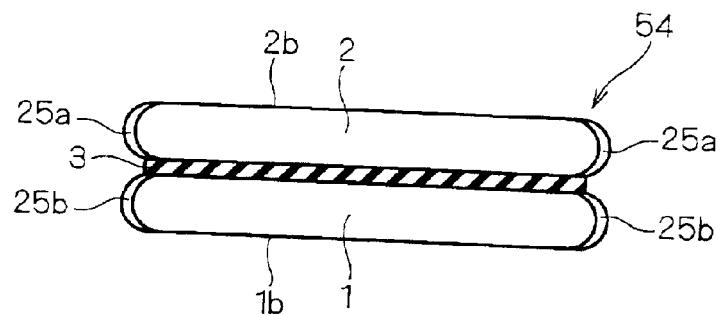
FIGS. 25 through 30 show a method of manufacturing an SOI wafer according to a ninth preferred embodiment of the invention in sequential order.

FIGS. 25 through 30 show a method of manufacturing an SOI wafer according to the ninth preferred embodiment of the present invention in sequential order. Referring to FIG. 25, a laminated wafer 54 is first formed by the same steps as in the background art shown in FIGS. 31 through 39. Scratch receiving parts 25a and 25b resulting from the contact with the boat are formed on the side surfaces of the silicon wafers 1 and 2 of the laminated wafer 54.

Figure 26:
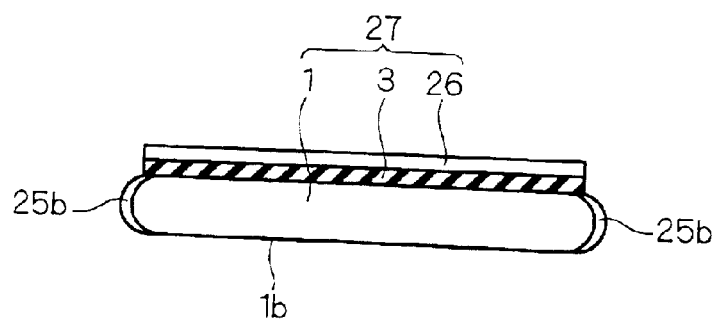

Next, referring to FIG. 26, the aforementioned chemical-mechanical polishing or the like is used to make the silicon wafer 2 into a thin film from the side of the second main surface 2b, thereby forming an SOI wafer 27 having an element forming layer 26. Making the silicon wafer 2 into a thin film causes the scratch receiving part 25a formed on the side surface of the silicon wafer 2 to be removed.

Figure 27:
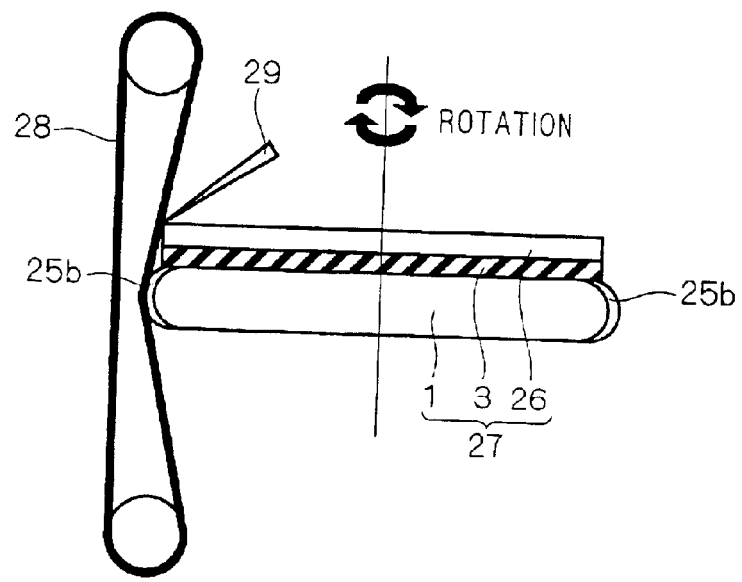

Next, referring to FIG. 27, the side surface of the silicon wafer 1 is pressed against an abrasive cloth belt 28 while rotating the SOI wafer 27, thereby removing the scratch receiving part 25b by abrasion. At this time, an abrasive 29 made of an alkaline solution including $SiO_2$ particles may be injected into a contact part between the abrasive cloth belt 28 and the side surface of the silicon wafer 1.

Figure 28:
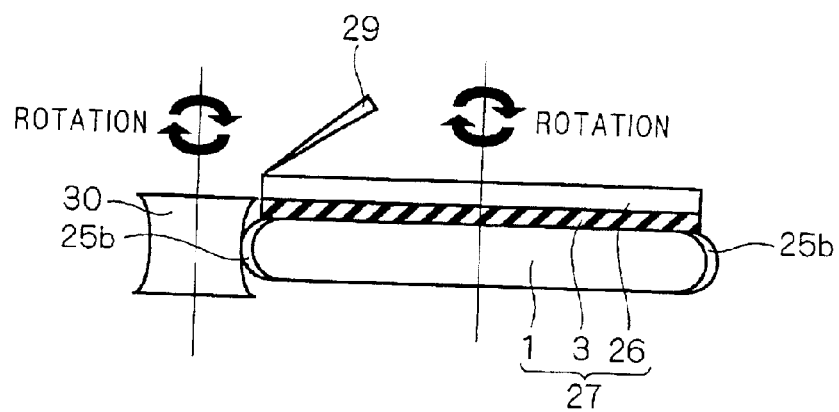

Alternatively, referring to FIG. 28, the side surface of the silicon wafer 1 is pressed against a grindstone 30 while rotating the SOI wafer 27, thereby removing the scratch receiving part 25b by abrasion. At this time, the abrasive 29 as above described may be injected into a contact part between the grindstone 30 and the side surface of the silicon wafer 1.

Figure 29:
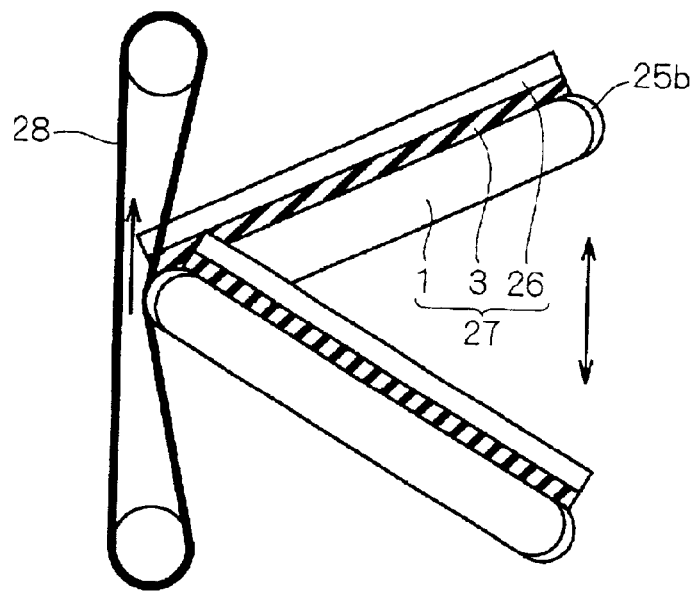
Figure 30:
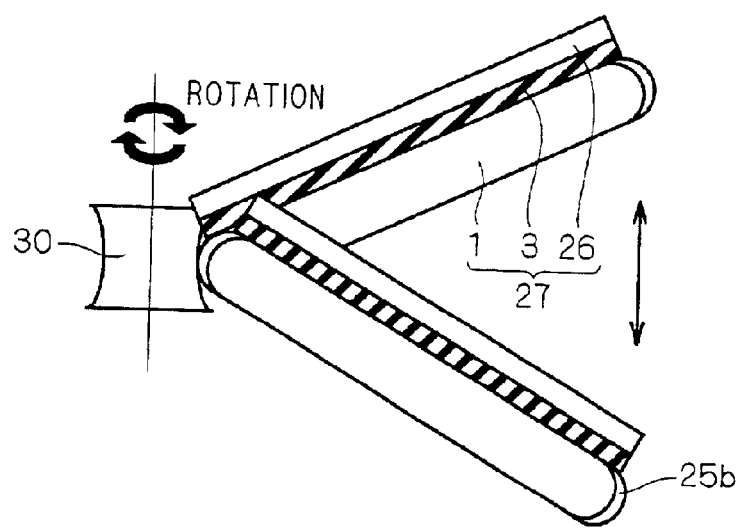
Figure 31:
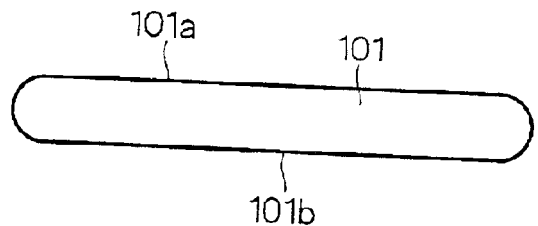
FIGS. 31 through 39 show a conventional method of manufacturing an SOI wafer in sequential order.
Figure 32:
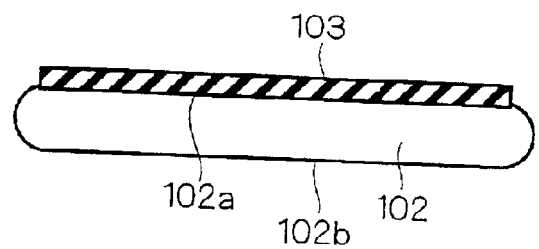
Figure 33:
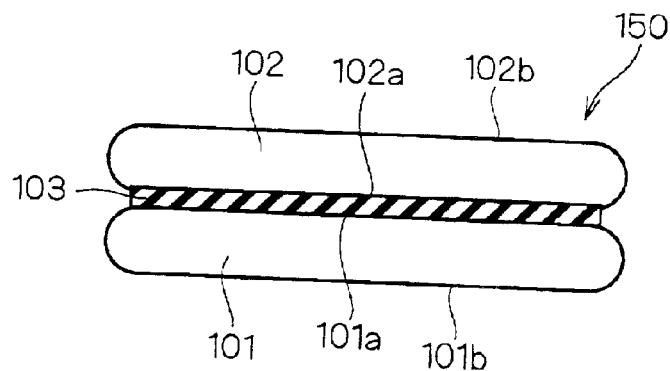
Figure 34:
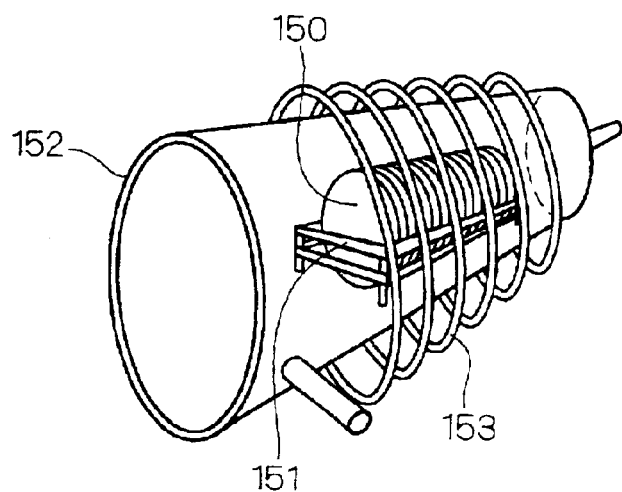
Figure 35:
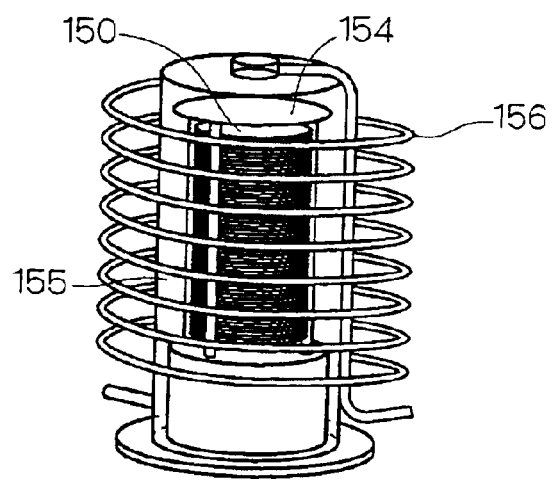
Figure 36:
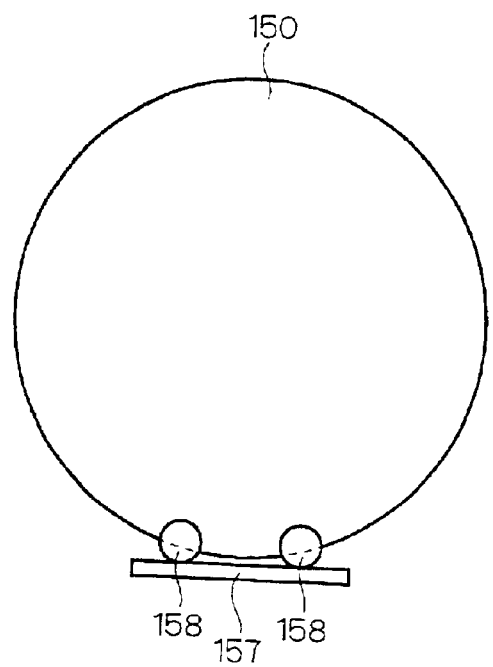

As shown in FIGS. 29 and 30, the SOI wafer 27 may be moved up and down to thoroughly vary the contact part between the side surface of the silicon wafer 1 and the abrasive cloth belt 28 or the grindstone 30. This allows the scratch receiving part 25b to be removed without failure.

Completed by the above steps is the SOI wafer 27 having the silicon wafer 1 from which the scratch receiving part 25b has been removed. Thereafter, a semiconductor element is formed in the element forming layer 26 of the SOI wafer 27 through various manufacturing processes.

As has been described, in the method of manufacturing the SOI wafer according to the present embodiment, the scratch receiving part 25b of the silicon wafer 1 is removed after obtaining the SOI wafer 27 having the scratch receiving part 25b resulting from the contact with the boat and before starting a process of forming a semiconductor element. Therefore, in the process of forming a semiconductor element in the element forming layer 26, occurrence of a heat crack in the SOI wafer 27 can be suppressed, which allows an increase in yields.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing an SOI wafer comprising steps of:

(a) preparing a first semiconductor wafer to be a supporting substrate of said SOI wafer and a second semiconductor wafer to be an element forming layer of said SOI wafer;

(b) bonding said first and said second semiconductor wafers to each other with an insulation layer interposed therebetween, thereby forming a laminated wafer;

(c) preparing a boat supporting said laminated wafer;

(d) mounting said laminated wafer on said boat in the state that at least a side surface of said first semiconductor wafer is not in contact with said boat; and (e) conducting heat treatment for improving bonding strength between said first and said second semiconductor wafers, said step (e) being executed after said step (d), wherein said boat prepared in said step (c) is provided with a recess having a first bottom surface and a second bottom surface placed in a position lower than said first bottom surface, and in said step (d), said laminated wafer is mounted on said boat in the state that a side surface of said second semiconductor wafer is in contact with said first bottom surface, and said side surface of said first semiconductor wafer is not in contact with said second bottom surface, said method further comprising the step of (f) forming said element forming layer of said SOI wafer by removing a surface of said second semiconductor wafer, said step (f) being executed after said step (e).

2. The method of manufacturing an SOI wafer according to claim 1, wherein
said first semiconductor wafer has a first main surface which is in contact with said insulation layer and a second main surface which is not in contact with said insulation layer, and
in said step (d), said laminated wafer is mounted on said boat in the state that said side surface and said second main surface of said first semiconductor wafer are not in contact with said boat.

3. The method of manufacturing an SOI wafer according to claim 1, wherein
said first bottom surface of said recess provided for said boat prepared in said step (c) has a width in the direction that said first and said second semiconductor wafers are laminated which is smaller than a thickness of said second semiconductor wafer.

4. The method of manufacturing an SOI wafer according to claim 1, wherein
said boat prepared in said step (c) is provided with a recess having a first side surface and a second side surface placed in a position deeper than said first side surface, and
in said step (d), said laminated wafer is mounted on said boat in the state that a side surface of said second semiconductor wafer is in contact with said first side surface, and a side surface of said first semiconductor wafer is not in contact with said second side surface,
said method further comprising the step of
(f) forming said element forming layer of said SOI wafer by removing a surface of said second semiconductor wafer, said step (f) being executed after said step (e).

5. The method of manufacturing an SOI wafer according to claim 4, wherein said first side surface of said recess provided for said boat prepared in said step (c) has a height in the direction that said first and said second semiconductor wafers are laminated which is smaller than a thickness of said second semiconductor wafer.

6. The method of manufacturing an SOI wafer according to claim 1, wherein
said second semiconductor wafer prepared in said step (a) has a diameter greater than that of said first semiconductor wafer,
said boat prepared in said step (c) is provided with a predetermined recess, and in said step (d), said laminated wafer is mounted on said boat in the state that said second semiconductor wafer is inserted into said recess,
and said first semiconductor wafer is not inserted into said recess, said method further comprising the step of (f) forming said element forming layer of said SOI wafer by removing a surface of said second semiconductor wafer, said step (f) being executed after said step (e).

7. The method of manufacturing an SOI wafer according to claim 1, further comprising the step of
(f) forming a protective film at least on said side surface of said first semiconductor wafer, said step (f) being executed before said step (d).

8. The method of manufacturing an SOI wafer according to claim 7, wherein
said first semiconductor wafer includes a plurality of first semiconductor wafers, and
said step (f) includes the steps of:
(f-1) laminating said plurality of first semiconductor wafers, thereby forming a laminated structure;
(f-2) forming said protective film on a surface of said laminated structure; and
(f-3) separating said laminated structure into each one of said plurality of first semiconductor wafers, said step (f-3) being executed after said step (f-2).

9. The method of manufacturing an SOI wafer according to claim 7, wherein
said first semiconductor wafer has a first main surface which is in contact with said insulation layer and a second main surface which is not in contact with said insulation layer, and
in said step (f), said protective film is formed on said side surface and said second main surface of said first semiconductor wafer.

10. The method of manufacturing an SOI wafer according to claim 9, wherein
said first semiconductor wafer includes two first semiconductor wafers, and
said step (f) includes the steps of:
(f-1) laminating said two first semiconductor wafers with their first main surfaces being in contact with each other, thereby forming a laminated structure;
(f-2) forming said protective film on a surface of said laminated structure; and
(f-3) separating said laminated structure into each one of said two first semiconductor wafers, said step (f-3) being executed after said step (f-2).

11. The method of manufacturing an SOI wafer according to claim 1, wherein
said second semiconductor wafer has a first main surface which is in contact with said insulation layer and a second main surface which is not in contact with said insulation layer,
said boat prepared in said step (c) includes a wafer supporting part with a plurality of projections formed thereon, and
in said step (d), said laminated wafer is placed on said wafer supporting part in the state that said plurality of projections and said second main surface of said second semiconductor wafer are in contact with each other.

* * * * *